United States Patent
Ganti et al.

(10) Patent No.: US 12,052,924 B2
(45) Date of Patent: Jul. 30, 2024

(54) METHOD AND SYSTEM FOR FABRICATING A PIEZOELECTRIC DEVICE

(71) Applicant: Frore Systems Inc., San Jose, CA (US)

(72) Inventors: Suryaprakash Ganti, Los Altos, CA (US); Leonard Eugene Fennell, San Jose, CA (US); Ming Tung, Fremont, CA (US); Brian James Gally, Los Gatos, CA (US)

(73) Assignee: Frore Systems Inc., San Jose, CA (US)

( * ) Notice: Subject to any disclaimer, the term of this patent is extended or adjusted under 35 U.S.C. 154(b) by 489 days.

(21) Appl. No.: 16/723,363

(22) Filed: Dec. 20, 2019

(65) Prior Publication Data

US 2021/0193900 A1 Jun. 24, 2021

(51) Int. Cl.
*H10N 30/50* (2023.01)
*H10N 30/067* (2023.01)
*H10N 30/20* (2023.01)
*H10N 30/85* (2023.01)
*H10N 30/87* (2023.01)
*H04L 41/083* (2022.01)

(52) U.S. Cl.
CPC .......... *H10N 30/50* (2023.02); *H10N 30/067* (2023.02); *H10N 30/206* (2023.02); *H10N 30/85* (2023.02); *H10N 30/871* (2023.02)

(58) Field of Classification Search
CPC ............... H01L 41/083; H01L 41/0471; H01L 41/0986; H01L 41/18; H01L 41/297; H01L 41/0815; H01L 41/22; H01L 41/1876; H01L 41/318; H01L 41/319; H01L 41/314
See application file for complete search history.

(56) References Cited

U.S. PATENT DOCUMENTS

| 7,240,409 B2 | 7/2007 | Sumi |
| 8,678,787 B2 | 3/2014 | Hirata |
| 8,684,707 B2 | 4/2014 | Kanai |

(Continued)

FOREIGN PATENT DOCUMENTS

| DE | 10354964 A1 * | 6/2004 | .......... B41J 2/14209 |
| DE | 102018107489 A1 * | 10/2019 | ............... H03H 3/02 |

(Continued)

OTHER PUBLICATIONS

Fast roll to roll slot die transfer coating system 400mm width & 6 m/min speed for battery fabrication—MSK-AFA-SD400. MTI Corp—Leading provider of lab equipment and advanced crystal substrates. (2017). https://www.mtixtl.com/MSK-AFA-SD400.aspx.*

(Continued)

*Primary Examiner* — Jarrett J Stark
(74) *Attorney, Agent, or Firm* — Van Pelt, Yi & James LLP

(57) ABSTRACT

A method for providing a piezoelectric device is described. The method includes providing a first electrode layer on a substrate and coating at least one layer of piezoelectric material. The coating using at least one of slot-die coating, dip coating, aerosol coating and R2R coating such that a layer of the at least one layer of piezoelectric material has a variation in thickness of not more than ten percent. The layer(s) of piezoelectric materials are also heat treated. Multiple layers of piezoelectric material may be slot-die coated and heat treated to provide a multilayer having the desired thickness. A second electrode layer is provided on the layer(s) of piezoelectric material.

13 Claims, 8 Drawing Sheets

(56) References Cited

U.S. PATENT DOCUMENTS

| | | |
|---|---|---|
| 8,899,944 B2 | 12/2014 | Kanai |
| 2011/0260578 A1* | 10/2011 | Bharti .................. H01L 41/183 |
| | | 310/314 |
| 2013/0112910 A1* | 5/2013 | Noguchi ............. H01L 41/0973 |
| | | 252/62.9 PZ |
| 2018/0187672 A1 | 7/2018 | Tanaka |
| 2018/0198055 A1 | 7/2018 | Zhong |
| 2018/0356303 A1* | 12/2018 | Li ........................... G06F 3/044 |

FOREIGN PATENT DOCUMENTS

| | | | | |
|---|---|---|---|---|
| EP | 1617491 A2 * | 1/2006 | ........... | H01L 41/314 |
| JP | S60155224 U * | 10/1985 | | |

OTHER PUBLICATIONS

Murata Manufacturing Co., Ltd., Microblower MZB1001T02, Microblower (Air Pump), Micro Mechatronics, Apr. 2014, downloaded from: https://www.murata.com/en-us/products/mechatronics/fluid/microblower_mzb1001t02.

* cited by examiner

METHOD AND SYSTEM FOR FABRICATING A PIEZOELECTRIC DEVICE

BACKGROUND OF THE INVENTION

Piezoelectric devices, such as piezoelectric actuators, are usable in a variety of applications. A piezoelectric actuator includes a piezoelectric film electrically coupled to two electrodes. Electrical current or voltage is provided to the electrodes. The piezoelectric film converts the current or voltage to mechanical motion, causing the actuator to move. For example, the actuator may vibrate.

In order to fabricate such a piezoelectric device, a bottom electrode may be deposited on a substrate and the piezoelectric film provided on the bottom electrode. For example, the piezoelectric film might be sputtered or spin-coated on the electrode. A top electrode is deposited on the piezoelectric film. Although this fabrication process can provide piezoelectric devices, additional methods for fabricating piezoelectric devices are desired.

BRIEF DESCRIPTION OF THE DRAWINGS

Various embodiments of the invention are disclosed in the following detailed description and the accompanying drawings.

DETAILED DESCRIPTION

Figure 1:
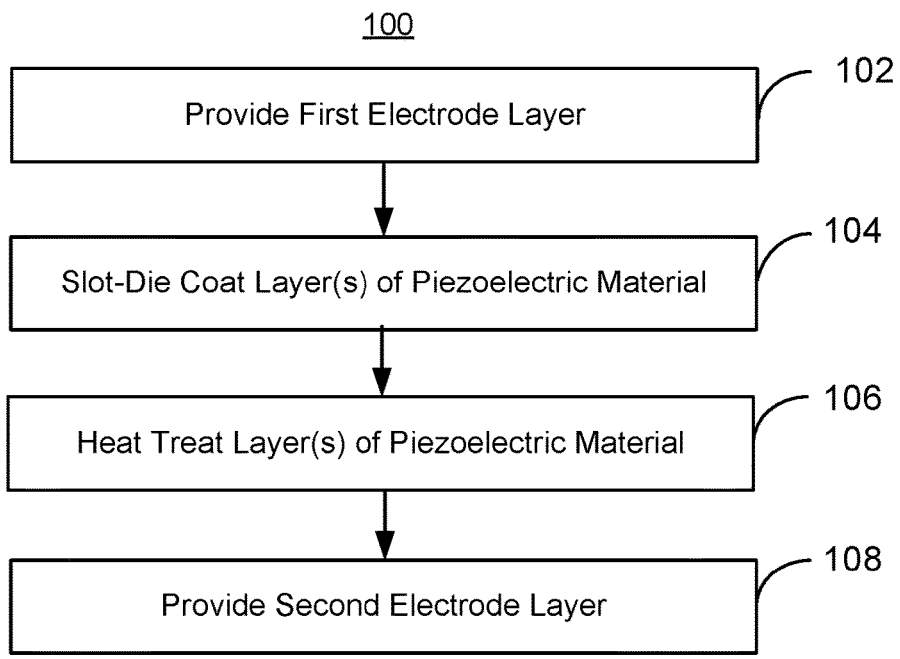
FIG. 1 depicts an embodiment of a method for providing a piezoelectric device.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In order to fabricate piezoelectric devices, such microelectro-mechanical system (MEMS) piezoelectric devices, a bottom electrode may be deposited on a substrate such as a silicon wafer. A piezoelectric film is provided on the bottom electrode. For example, the piezoelectric film might be sputtered or spin-coated on the electrode. A top electrode is deposited on the piezoelectric film. The silicon substrate may be cleaved or otherwise divided to separate the components fabricated into individual MEMS devices. Although this fabrication process can provide piezoelectric devices, additional methods for fabricating piezoelectric devices, particularly MEMS piezoelectric devices, are desired.

A mechanism for providing a piezoelectric device is described. A first electrode layer is provided on a substrate. At least one layer of piezoelectric material is coated on the electrode. In some embodiments, the coating is performed using at least one of slot-die coating, dip coating, aerosol coating and R2R coating such that a layer of the at least one layer of piezoelectric material has a variation in thickness of not more than ten percent. The layer(s) of piezoelectric materials are also heat treated. A second electrode layer is provided on the layer(s) of piezoelectric material. In some embodiments, a slot-die coated layer of piezoelectric has a thickness of at least one hundred nanometers. In some embodiments, the layer may be at least two hundred nanometers thick. In some embodiments, the layer may have a thickness of greater than three hundred nanometers. In some embodiments, the slot-die coated layer may have a thickness of at least three hundred fifty micrometers. In some such embodiments, the thickness of the layer may be at least four hundred nanometers or more. Multiple layers of piezoelectric material may be slot-die coated and heat treated to provide a piezoelectric multilayer having the desired thickness. The thickness of the multilayer (i.e. the piezoelectric material) may be at least one micrometer. In some embodiments, the multilayer thickness is at least five micrometers. The thickness of the multilayer is least ten micrometers in some embodiments. In some embodiments, the multilayer is at least twenty micrometers thick. In some embodiments, the thickness of the multilayer is not more than twenty micrometers.

In some embodiments, the slot-die coating process includes slot-die coating the layer(s) of piezoelectric material on the substrate having a width of at least one hundred millimeters. In some embodiments, the substrate has a width of at least two hundred millimeters. In some such embodiments, the substrate has a width of at least three hundred millimeters. The length of the substrate may be at least the same as or greater than the substrate width. In some embodiments, the surface roughness of the substrate is desired to be low. For example, the surface roughness may not exceed three nanometers. In some embodiments, the surface roughness is not more than one nanometers. In other embodiments, the surface roughness may be at least one nanometer and not more than three nanometers. In some embodiments, the substrate may be or include stainless steel and/or Hastelloy. The thickness of the substrate in such embodiments, may not exceed one hundred micrometers. In some embodiments, the substrate thickness may be not more than one hundred fifty micrometers. For example, the thickness may be nominally one hundred micrometers.

In some embodiments, barrier layer(s) and/or seed layers may be provided. The barrier layer may be between the first electrode and the substrate. In some embodiments, the seed and/or barrier layer may also function as the electrode layer. In some embodiments, the substrate may also act as the electrode. In such embodiments, providing the electrode may be accomplished by selecting the appropriate substrate.

The piezoelectric layer(s) may also be poled. In some embodiments, poling takes place before deposition of the second electrode. In other embodiments, poling occurs after the deposition of the second electrode. The substrate described above may be divided into multiple piezoelectric devices.

In some embodiments, the substrate may be thinned, for example after the second electrode has been provided. In some such embodiments, an etch stop layer may be provided. For example, the etch stop layer might be deposited before the first electrode. In such embodiments, the piezoelectric device and etch stop layer are provided on a top surface of the substrate. A portion of the substrate may be removed from the back surface (opposite to the top surface) to provide a thinned substrate not more than twenty micrometers thick. In some embodiments, this thickness includes the etch stop layer and the substrate. In some embodiments, the thinned substrate is not more than ten micrometers thick. In some embodiments, at least a portion of the substrate may be completely removed and a back side of the etch stop layer exposed.

Thus, piezoelectric devices, such as piezoelectric actuators may be reliably fabricated. Further, because such a device may be fabricated on large substrates, fabrication of such piezoelectric devices may be readily scaled up. Further, the desired thicknesses of piezoelectrics may be obtained. Consequently, fabrication of piezoelectric devices may be improved.

Figure 2A:
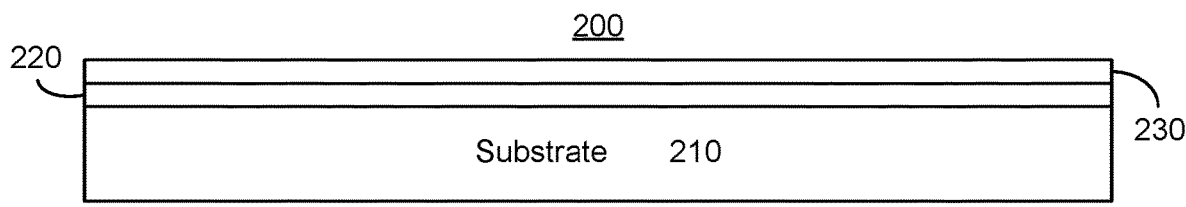
FIGS. 2A-2C depict an embodiment of a piezoelectric device during fabrication.
Figure 2B:
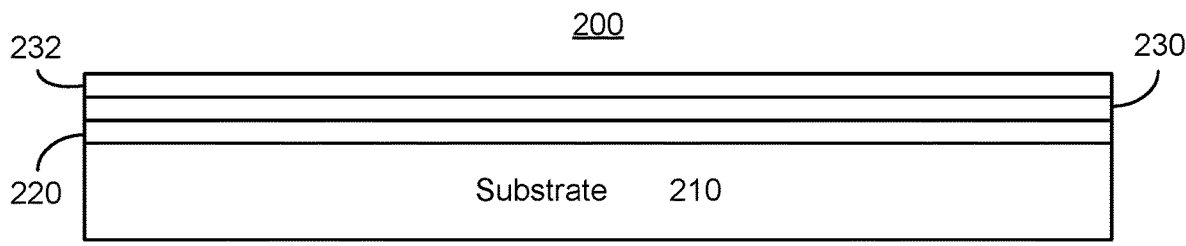
Figure 2C:
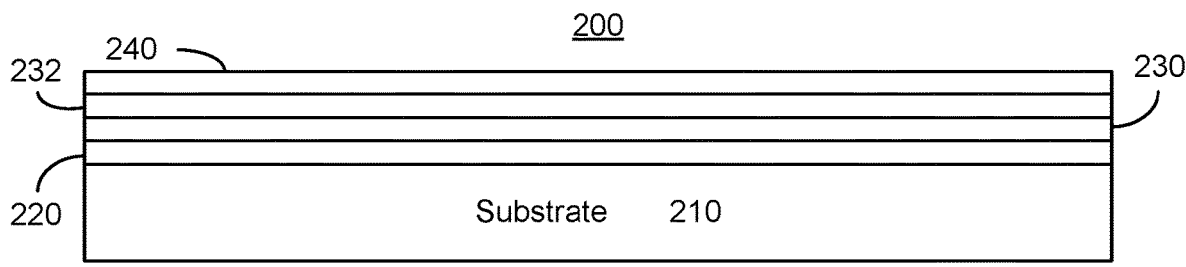

FIG. 1 depicts an embodiment of method 100 for providing a piezoelectric device. For simplicity, not all steps are shown. Further, the steps may be performed in another order, include substeps and/or be combined. FIGS. 2A-2C are diagrams depicting a piezoelectric device 200 during fabrication. For clarity, not all components are shown. In addition, FIGS. 2A-2C are not to scale. Method 100 is described in the context of piezoelectric device 200. However, method 100 may be used in conjunction with other piezoelectric devices.

Layer(s) for a first electrode are provided, via 102. The electrode layer(s) may be a conductive metal that is deposited on a substrate. For example, the electrode might include Pt and/or other highly conductive metals. The electrode layer(s) may be sputtered, plated and/or otherwise deposited. The electrode layer(s) may also be patterned. In some embodiments, other layers may be interposed between the substrate and the electrode. For example, barrier and/or seed layers might be included. In some embodiments, the substrate is stainless steel or Hastelloy. In other embodiments, another substrate material may be utilized. In some embodiments, the substrate is desired to have a low surface roughness (or a high smoothness). If a conductive substrate is used, in some embodiments the conductive substrate may form part or all of the electrode provided in step 102.

At least one layer of piezoelectric material is slot-die coated on the electrode, at 104. Slot-die coating dispenses a controlled amount of liquid as the die moves across the surface of the substrate. Thus, a thin film of liquid having a controlled thickness is formed across the surface of the substrate. The liquid die-coated at 104 includes piezoelectric material(s) in one or more solvents. In some embodiments, the piezoelectric layer is lead zirconate titanate (e.g. (Pb[$Zr_xTi_{1-x}$]$O_3$), where x is greater than or equal to zero and less than or equal to one ($0 \leq x \leq 1$). In some embodiments piezoelectric material(s) other than or in addition to lead zirconate titanate (PZT) may be used. For example, doped PZT solutions may be used. Such PZT solutions including dopants such as lanthanum, niobium, manganese and/or magnesium can be added to the sol-gel. The addition of such doped PZT solutions may aid in controlling properties such as performance improvement, for improved poling efficiency and reliability. The thickness of the piezoelectric layer die-coated at 104 is at least one hundred nanometers in some embodiments. In some embodiments, the layer of piezoelectric is at least two hundred nanometers thick. The piezoelectric layer may be at least three hundred nanometers thick. In some embodiments, the piezoelectric layer has a thickness of greater than three hundred nanometers. In some embodiments, the slot-die coated piezoelectric layer has a thickness of at least three hundred fifty micrometers. In some such embodiments, the thickness of the layer may be at least four hundred nanometers or more. In some embodiments, the layer of piezoelectric material is not more than five hundred nanometers thick. Further, a larger area of a substrate may be evenly coated at 104. For example, in some embodiments, the width of the substrate coated at 104 may be at least one hundred millimeters. In some embodiments, the substrate width is at least three hundred millimeters. In some embodiments, the width of the substrate is at least six hundred millimeters. A larger width substrate may be used in some embodiments. This width of substrate may be evenly and completed coated at 104. For example, the thickness of a layer of piezoelectric may vary by not more than ten percent. In some embodiments, the thickness of the layer of piezoelectric material may vary by not more than five percent. An edge bead may occur during the coating at 104. If present, the edge bead is removed by an edge bead removal process to improve thickness uniformity to within the percentages described above. Edge bead removal may be carried out before pyrolization described below. The length of the substrate may be at least the same as or greater than the substrate width. Thus, at 104, the width and length of the substrate may be evenly and completely coated in the layer of piezoelectric having the thickness(es) described above. In some embodiments, a mechanism other than slot-die coating may be used to provide the piezoelectric layer(s) at 104. However, such a mechanism can evenly coat substrates of the widths described herein. For example, in some embodiments, roll-2-roll (R2R) coating may be used in lieu of slot die coating at 104. In R2R coating, the substrate is coated as a continuous roll. The R2R coating may coat the piezoelectric layer in the thicknesses and the evenness described herein.

The layer(s) of piezoelectric materials are heat treated, at 106. Heat treating at 106 may include multiple annealing, or baking, processes. For example, heat treating at 106 can include one or more lower temperature heat treatments to remove or evaporate the solvent(s) used in the slot-die coating process. In some embodiments, such heat treatments may be carried out in temperatures in the range of one hundred degrees Celsius to four hundred degrees Celsius. For example, solvent bake processes may be carried out from at least approximately room temperature to not more than approximately one hundred and fifty degrees Celsius. A vacuum assisted solvent baking may also be carried out. The vacuum assist may improve the uniformity and cycle time for a solvent bake. One or more additional higher temperature heat treatments may be performed for pyrolysis. Pyrolysis may be carried out in single or multiple steps. In some embodiments, such heat treatments may be carried out at temperatures in the range of at least two hundred and fifty degrees Celsius and not more than five hundred and fifty degrees Celsius. During pyrolysis, the polymer may convert into a cross-linked ceramic oxide network. Prior to pyrolysis, the sol-gel used to deposit the piezoelectric is similar to a small molecule polymer suspended in a solvent. Pyrolysis aids in converting the sol-gel into a ceramic matrix. Specific temperatures and times may be used so that that cross-linking happens, successfully collapsing the volume and shrinking the volume without voids as it hardens. In some embodiments, a heat treatment may also be used to crystallize the piezoelectric layers. Crystallization heat treatment temperatures may range from six hundred and fifty degrees Celsius to not more than eight hundred degrees Celsius. The temperatures selected may be based on dopants, film thickness, type of furnace used as well as the time involved. In some embodiments, for example, the crystallization temperature may be approximately seven hundred degrees Celsius. In some embodiments, 104 and 106 are alternately performed. For example, a layer of piezoelectric may be slot-die coated in 104 and heat treated at 106 before another layer of piezoelectric is slot-die coated and heat treated. Thus, 104 and 106 may be alternately performed until the desired number of piezoelectric layers has been provided. In some embodiments, however, crystallization need not be carried out or may be performed for only some iterations. For example, baking for crystallization may be performed for multiple piezoelectric layers.

FIG. 2A depicts piezoelectric device 200 after 104 and 106 have been performed once. Thus, electrode 220 and a first piezoelectric layer 230 have been formed on substrate 210. FIG. 2B depicts piezoelectric device 200 after a second iteration of 104 and 106 has been completed. Thus, second piezoelectric layer 232 is formed. Each piezoelectric layer 230 and 232 may have a thickness in the ranges described above. 102 and 104 may be repeated to provide the desired total thickness of a piezoelectric multilayer including layers such as layers 230 and 232. For example, such a piezoelectric multilayer may have a total thickness of at least one micrometer. In some embodiments, the piezoelectric multilayer may have a total thickness of at least five micrometers. In some such embodiments, the total thickness is at least ten micrometers. In some embodiments, the piezoelectric multilayer may be at least twenty micrometers thick. However, in some embodiments, the thickness of the piezoelectric multilayer may be limited, for example as not more than twenty micrometers. The variation in the total thickness is less than ten percent in some embodiments. In some such embodiments, the variation in the total thickness of the piezoelectric multilayer is not more than five percent.

One or more layers for a second, top electrode are provided, at 108. The electrode layer(s) provided at 108 may be printed, sputtered and/or otherwise deposited and patterned. FIG. 2C depicts piezoelectric device 200 after 108 has been performed. Although not shown, additional passivation layers may be provided to protect the underlying layers from moisture and handling. Consequently, top electrode 240 has been formed. In some embodiments, subsequent processing may be carried out. For example, substrate 210 may be thinned or removed and layers 220, 230, 232 and/or 240 patterned via photolithography. In addition, for substrates 210 of the sizes described above, piezoelectric device 200 may be divided into individual piezoelectric devices.

Using method 100, piezoelectric devices, such as piezoelectric device 200 may be formed. MEMS piezoelectric devices may be fabricated. Such a MEMS piezoelectric device has a total thickness of less than one millimeter and in some embodiments does not exceed two hundred and fifty microns. For example, the total thickness of a MEMS piezoelectric actuator formed using method 100 after all processing is completed may be less than fifty micrometers. Using slot-die coating in 104, thin, relatively constant thickness piezoelectric layers may be fabricated on a large substrate. Multiple such layers can be provided to produce a thicker piezoelectric layer (i.e. a multilayer) having relatively low variations in thickness across the substrate. As a result, piezoelectric devices in the desired size range may be reproducibly manufactured. For example, MEMs piezoelectric actuators can be reliably fabricated within acceptable tolerances. Further, because such piezoelectric layers may be fabricated on substrates having large surface areas, manufacturing of such piezoelectric devices may be scaled to higher throughputs. Consequently, producing piezoelectric devices, such as devices including MEMS piezoelectric actuators, may be improved.

Figure 3:
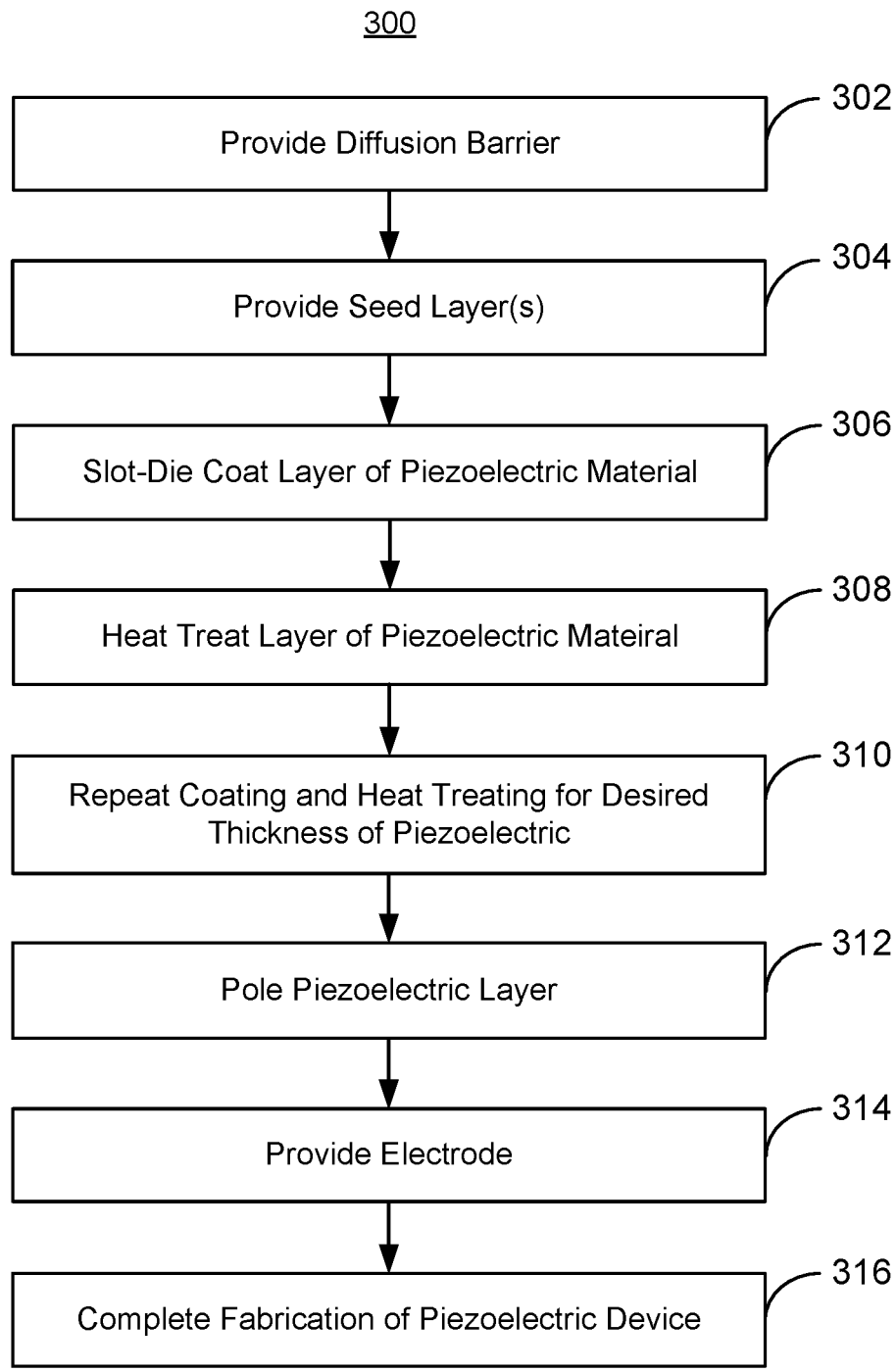
FIG. 3 depicts another embodiment of a method for fabricating a piezoelectric device.

FIG. 3 depicts another embodiment of method 300 for providing a piezoelectric device. For simplicity, not all steps are shown. Further, the steps may be performed in another order, include substeps and/or be combined. FIGS. 4A-4G are diagrams depicting a piezoelectric device 400 during fabrication. For clarity, not all components are shown. In addition, FIGS. 4A-4G are not to scale. Method 300 is described in the context of piezoelectric device 400. However, method 300 may be used in conjunction with other piezoelectric devices.

A substrate may be selected prior to or as part of method 300. In some embodiments, the substrate is stainless steel or Hastelloy. In other embodiments, another substrate material may be utilized. The substrate may be desired to have a low surface roughness (or a high smoothness). For example, the root mean square (RMS) surface roughness may not exceed thirty nanometers. In some embodiments, the RMS surface roughness is not more than ten nanometers. In other embodiments, the RMS surface roughness may be at least ten nanometer and not more than thirty nanometers. The substrate may also be desired to be thin and to have a large surface area. The thickness of the substrate in such embodiments may not exceed one hundred and fifty micrometers. In some embodiments, the substrate thickness may be not more than one hundred micrometers. For example, the thickness may be nominally one hundred micrometers. The surface area (e.g. width and length) may be as described above. For example, substrates having widths and/or lengths of three hundred through six hundred millimeters or more may be used. The substrate material may be chosen so that its coefficient of thermal expansion (CTE) matches that of PZT. In some embodiments, the CTEs may be selected to be slightly different to produce compressive stresses in PZT. These compressive stresses may aid in obtaining the low dielectric constant orientation in PZT (001). In some embodiments, substrate material used is a 400 series stainless steel. For example, SUS 430 may be used. The substrate may be stress-annealed along with having the roughness requirements of RMS less than 30 nanometers as measured using a typical optical metrology system.

A diffusion barrier is provided on a substrate, at 302. For example, the diffusion barrier may include aluminum oxide that is deposited on the substrate. One or more seed layers may also be provided, at 304. For example, 304 may include depositing a Ti/Pt bilayer. The seed layer may also function as a bottom electrode. Thus, depositing the seed layer at 304 and, in some embodiments, the diffusion barrier layer at 302 may be considered analogous to providing the electrode in method 100. In some embodiments, diffusion barrier layer(s) and/or the seed layer(s) are patterned. In other embodiments, 302 may include providing a lanthanum nickel oxide (LNO) layer, for example via sputtering. Sputtered LNO can be used as a conductive layer and as a barrier to chromium and iron migration from the steel substrate to the surface. The sputtered LNO is in crystallized form and may have substantially no voids. Crystallized LNO when used on AlOx serves as a seed layer for orienting PZT layers that are deposited subsequently and as a bottom electrode. The thickness of the crystallized LNO layer may be in the range of at least one hundred nanometers and not more than one hundred fifty nanometers. If dense LNO is sputtered directly on a stainless steel substrate, the LNO layer may serve as a barrier layer as well as a conductive layer. If LNO is used on the top surface of a stainless steel substrate, the backside of the stainless steel substrate is generally coated with AlOx or SiOx. Such coatings may be provided using backside sputtering.

A layer of piezoelectric material(s) is slot-die coated on the seed layer(s) (e.g. the electrode), at 306. As discussed above, slot-die coating dispenses liquid in controlled quantities across the surface of the substrate. Thus, a thin film of liquid used to form a piezoelectric layer and having a controlled thickness is provided across the surface of the substrate (e.g. on the seed layer(s)) at 306. In some embodiments, another mechanism capable of evenly coating substrates having the widths described above may be used to coat the piezoelectric layer(s). For example R2R coating, dip coating, spray coating, and/or aerosol coating may be used in some embodiments. In some embodiments, the piezoelectric is PZT. However, other and/or additional piezoelectric materials may be used in other embodiments. In some embodiments, the liquid include a PZT sol-gel with dopants such as La, Nb, Mn, and/or Mg. The thickness of the piezoelectric layer slot-die coated at 306 may be at least one hundred nanometers. In some embodiments, the layer of piezoelectric is at least two hundred nanometers thick. The piezoelectric layer may have a thickness of greater than three hundred nanometers. In some embodiments, the slot-die coated piezoelectric layer has a thickness of at least three hundred fifty nanometers. In some such embodiments, the thickness of the layer may be at least four hundred nanometers or more. In some embodiments, the layer of piezoelectric material is not more than five hundred nanometers thick. The thickness of the piezoelectric layer is also uniform. For example, the thickness of the piezoelectric layer may vary by not more than ten percent, excluding any edge beads formed. In some embodiments, this variation in thickness is not more than five percent, excluding edge beads. In some embodiments, 306 incorporates edge bead removal to remove the edge bead and to make the coating more uniform and less crack prone for subsequent depositions.

Figure 4A:
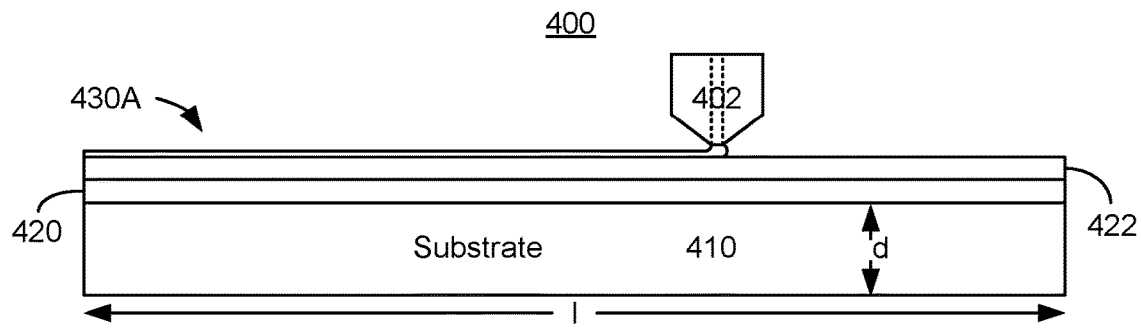
FIGS. 4A-4G depict another embodiment of piezoelectric devices during fabrication.

FIG. 4A depicts piezoelectric device 400 during 306. Substrate 410 having length 1, thickness d and width w is shown. The width is perpendicular to the plane of the page in FIG. 4A and is explicitly shown in FIG. 4B. Referring back to FIG. 4A, d may be nominally one hundred micrometers, the width w may be three hundred millimeters or more and length 1 may be at least as large as width w. Barrier layer(s) 420 and seed layer(s) 422 have also been provided. Slot-die 402 is also shown dispensing layer 430A of piezoelectric liquid.

The layer of piezoelectric is heat treated, at 308. Heat treating at 308 may include a single baking process or multiple baking processes. In some embodiments, the temperature ranges described above for method 100 may be used at 306. For example, heat treating at 308 can include a first heat treatment for removal the solvent(s) used in the slot-die coating process; a second heat treatment also for solvent removal and a third heat treatment at four hundred and fifty degrees Celsius for pyrolysis. In some embodiments, a heat treatment may also be used to crystallize the piezoelectric. This crystallization heat treatment may occur after each layer is provided, after some number of layers have been provided or at the end of fabrication (e.g. one crystallization for all piezoelectric layers). For example, the heat treatment for crystallization may be performed after coating and heat treating of every other layer. Thus, individual layers of piezoelectric are formed.

Figure 4B:
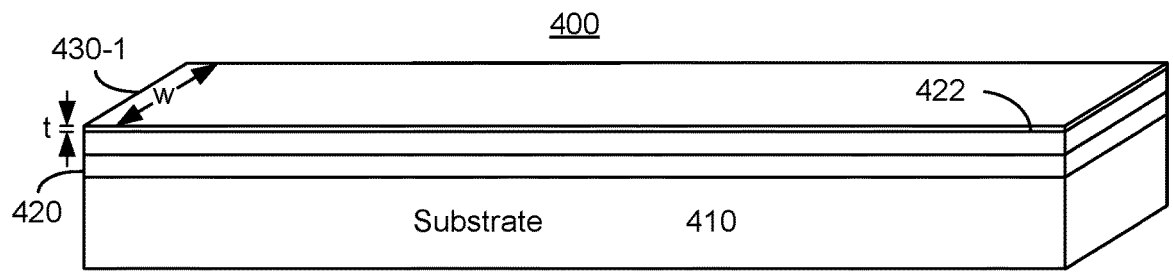

FIG. 4B depicts piezoelectric device 400 after 308 has been performed. Thus, piezoelectric layer 430-1 having thickness, t, has been formed on seed layer(s) 422. The thickness of piezoelectric layer 430-1 may be as described above. For example, piezoelectric layer 430-1 may be at least two hundred nanometers thick (t≥200 nanometers), or thicker in some embodiments. As can be seen in FIG. 4B, piezoelectric layer 430-1 is also of relatively constant thickness across the large surface of substrate 410. For example, the variations in the thickness, t, may be in the ranges discussed above. This control over the thickness of piezoelectric layer 430-1 may be due in part to the use of slot-die coating as well as to the low surface roughness of substrate 410. Seed layer(s) 422 may be selected to control orientation of piezoelectric layer 430-1 (as well as subsequent piezoelectric layers). For PZT, a (001) orientation is generally desired. The first coating 430-1 may be not more than seventy-five nanometers thick. In some embodiments, layer 430-1 is less than seventy-five nanometers thick. For example, first piezoelectric layer 430-1 may be nominally fifty nanometers thick. Using a lower thickness for first piezoelectric layer 430-1 may be more likely to provide the desired orientation. Subsequent layers are baked in such a way that the grain initiation occurs at this interface and may be epitaxially grown. Because PZT includes Zirconium/Ti, there may be concentration differences between these two elements from bottom of each piezoelectric layer to the top of the piezoelectric layer. The gradient in concentration may depend on the temperature, thickness and lead evaporation during the baking step. In some embodiments, these variations in concentration may depend upon other factors. To reduce or eliminate the occurrence of Zr/Ti rich areas along the thickness of the piezoelectric multilayer, multiple layers with different concentrations of Zr/Ti are employed and crystallized together. Thus, layers deposited after piezoelectric layer 430-1 may have different concentrations of Zr/Ti. For example, for PZT, layer 430-1 may have Zr/Ti of 40/60, a next layer (e.g. 430-2 shown in FIG. 4D) may have Zr/Ti of 50/50, and a third layer may have Zr/Ti of 60/40. Consequently, the three layers together may have Zr/Ti of 50/50. In some embodiments, Zr/Ti of at least 52/48 and not more than 53/47 is desired to improve performance of the piezoelectric multilayer.

Figure 4C:
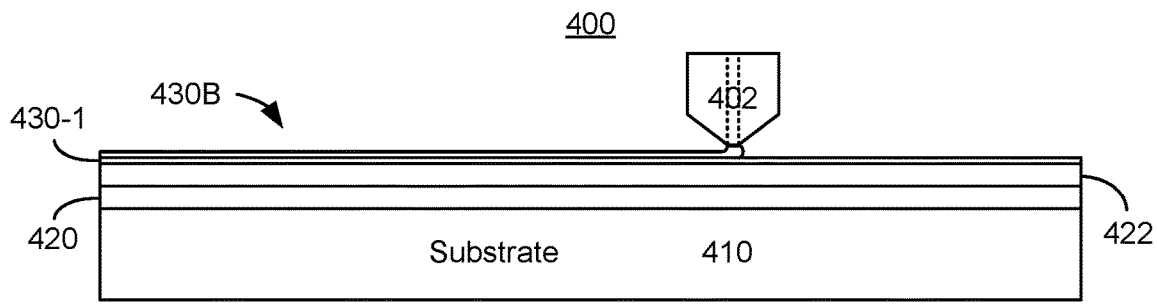
Figure 4D:
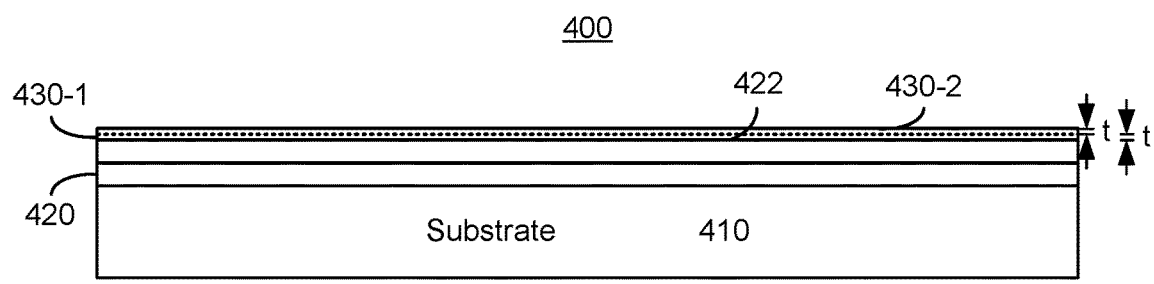

The slot-die coating in 306 and heat treating in 308 are alternately repeated, at 310. These steps are repeated to provide a piezoelectric having a desired total thickness. For example, FIGS. 4C and 4D depict the slot-die coating of another liquid piezoelectric layer 430B during a repetition of 306. FIG. 4D depicts piezoelectric device 400 after 308 has been repeated. Thus, solvent(s) have been removed and crystallization (if performed) may be completed. Consequently, piezoelectric device 400 includes a second piezoelectric layer 430-2. Because layers 430-1 and 430-2 are part of the same piezoelectric being formed, layers 430-1 and 430-2 are separated by a dashed line. Piezoelectric layer 430-2 may have a thickness in the range described herein. In the embodiment shown, each layer 330-1 and 330-2 has a thickness of t. Thus, the layers 430-1 and 430-2 of piezoelectric may be approximately the same thickness. In some embodiments, the thicknesses of piezoelectric layers 430-1 and 430-2 may differ. In some embodiments, the heat treatment in 308 for crystallization was not performed after piezoelectric layer 430-1 is formed, but is performed for piezoelectric layer 430-2. In such embodiments, the crystallization heat treatment is performed for every other layer. In other embodiments, crystallization might be performed at other time(s).

Figure 4E:
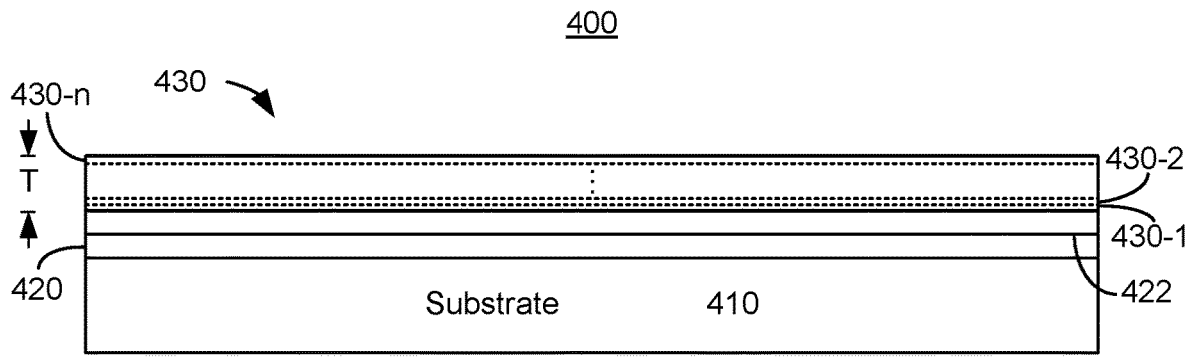

FIG. 4E depicts piezoelectric device 400 after 306 and 308 have been repeated a desired number of times at 310. Thus, n piezoelectric layer are present. For clarity, only piezoelectric layers 430-1, 430-2 and 430-n are labeled. Because layers 430-1, 430-2 through 430-n are part of the same piezoelectric multilayer 430, layers 430-1, 430-2 and 430-n are delineated by dashed lines. Piezoelectric multilayer 430 has a total thickness, T, that is relatively large. For example, T may be at least one micrometer. In some embodiments, T may be at least five micrometers. In some embodiments, T may be at least ten micrometers. In some embodiments, piezoelectric multilayer 430 may be at least twenty micrometers thick. However, in some embodiments, the thickness of the piezoelectric multilayer 430 may be limited. For example, T may be not more than twenty micrometers in some embodiments.

In some embodiments, the piezoelectric layer is poled, at 312. Poling aligns the dipoles in the piezoelectric layer to enhance (or obtain) the piezoelectric effect. In some embodiments, 312 may be accomplished using a corona. Thus, a large DC field may be applied to the piezoelectric layer. In some embodiments, a device such as a scorotron may be used to develop a corona having uniform fields across the substrate. However, in other embodiments, another mechanism for poling the piezoelectric may be used.

Figure 4F:
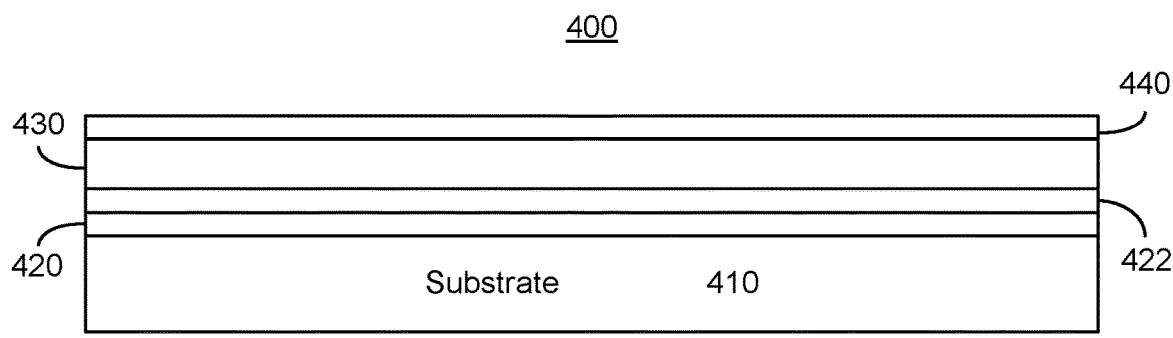

A top electrode is provided, at 314. The electrode provided at 314 may formed by printing, sputtering and/or otherwise depositing conductive layer(s) for the electrode and, optionally, patterning the layer(s). In some embodiments, poling at 312 is performed before electrode deposition at 314. In other embodiments, poling at 312 is performed after electrode deposition at 314. FIG. 4F depicts piezoelectric device 400 after 314 has been performed. Consequently, top electrode 440 has been formed on piezoelectric multilayer 430.

Figure 4G:
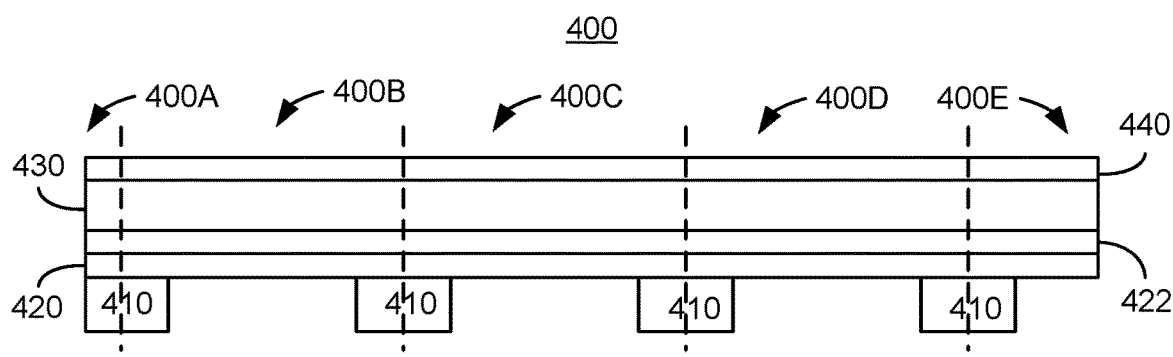

Subsequent processing may be carried out to complete the piezoelectric devices, at 316. For example, the substrate may be thinned or removed, portions of the piezoelectric devices patterned, additional structures may be formed and the substrate separated into multiple devices. For example, FIG. 4G depicts piezoelectric device 400 after portions of substrate 410 have been removed. Dashed lines in FIG. 4E depict where device 400 may be cut to separate out individual devices (e.g. piezoelectric actuators) 400A, 400B, 400C, 400D and 400E.

Using method 300, MEMS piezoelectric devices, such as piezoelectric devices 400A, 400B, 400C, 400D and 400E may be fabricated. Such MEMS piezoelectric devices have a total thickness (including substrate 410) of less than one millimeter and in some embodiments do not exceed two hundred and fifty microns. Using slot-die coating or a similar technique, thin, relatively constant thickness piezoelectric layers may be fabricated on a large substrate. Multiple such layers can be provided to produce a thicker piezoelectric multilayer having the desired thickness and relatively low variations in thickness across the substrate. As a result, manufacturing of piezoelectric devices in the desired size range, such as MEMS piezoelectric devices, may be more reliable. Further, because such piezoelectric layers may be fabricated on substrates having large surface areas, manufacturing of such piezoelectric devices may be scaled to higher throughputs. Consequently, producing MEMS piezoelectric devices may be improved.

Figure 5:
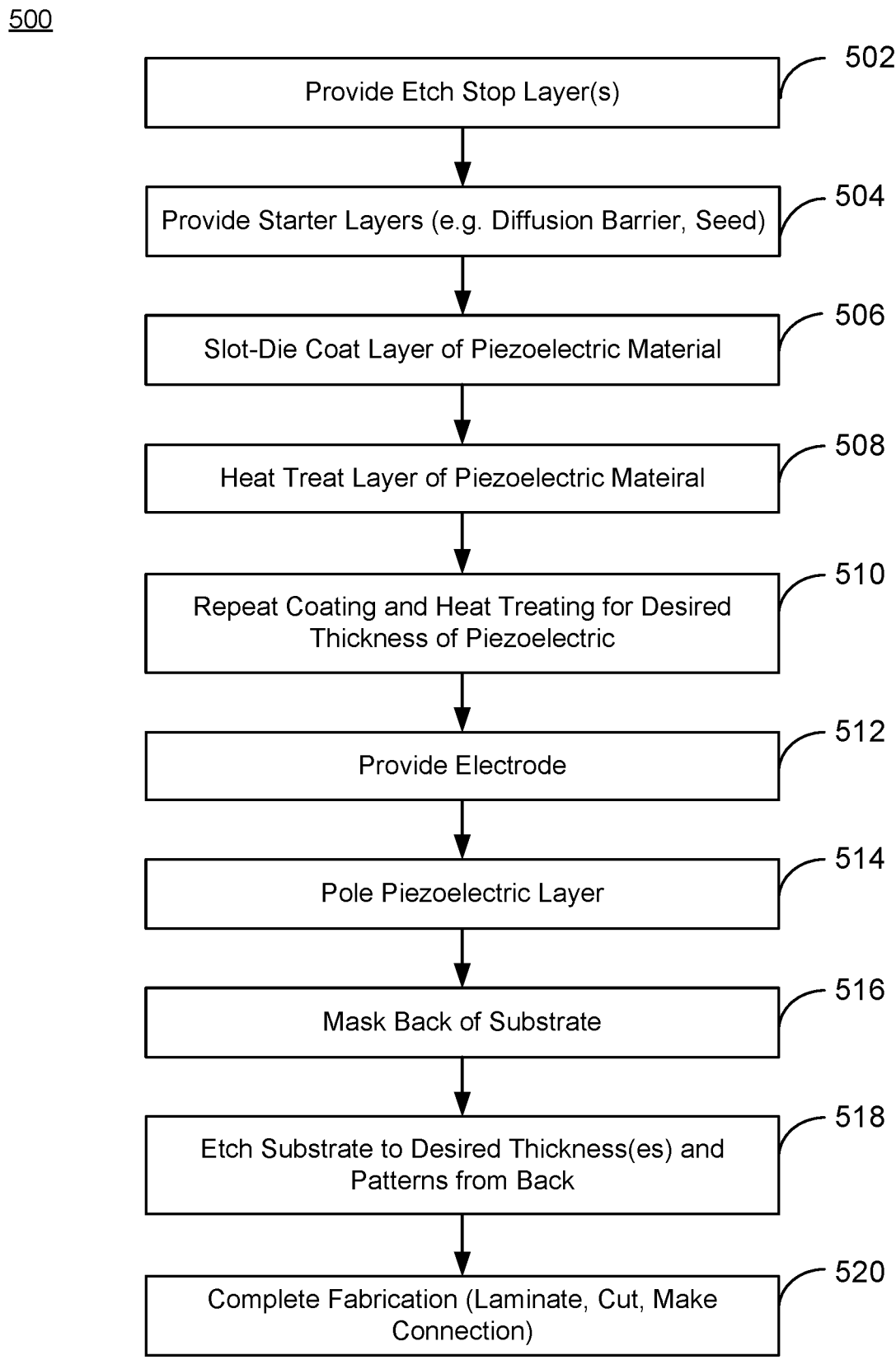
FIG. 5 depicts another embodiment of a method for fabricating a piezoelectric device.

FIG. 5 depicts another embodiment of method 500 for providing a piezoelectric device. For simplicity, not all steps are shown. Further, the steps may be performed in another order, include substeps and/or be combined. FIGS. 6A-6J are diagrams depicting a piezoelectric device 600 during fabrication. For clarity, not all components are shown. In addition, FIGS. 6A-6J are not to scale. Method 500 is described in the context of piezoelectric device 600. However, method 500 may be used in conjunction with other piezoelectric devices.

A substrate may be selected prior to or as part of method 400. In some embodiments, the substrate is stainless steel or Hastelloy. The substrate may be desired to have a low surface roughness (e.g. an RMS surface roughness of one through thirty nanometers), a small thickness (e.g. nominalsly one hundred micrometers) and a large surface area (e.g. width and length of three hundred millimeters or more), as described above. In other embodiments, another substrate material(s) having other properties may be utilized.

One or more etch stop layers are provided, at 502. In some embodiments, Ni is deposited at 502. At least five micrometers and not more than fifteen micrometers of Ni may be deposited in some embodiments. For example, nominally ten micrometers may be deposited. Ni may be used for a stainless steel substrate because Ni has similar properties to stainless steel, but may function as an etch stop layer for a stainless steel etch.

Starter layers for the piezoelectric are provided, at 504. In some embodiments, a diffusion barrier and seed layer(s) are formed at 504. For example, an aluminum oxide diffusion barrier and a Ti/Pt seed bilayer may be provided. Thus, 504 is analogous to 302 and 304 of method 300. The seed layer(s) formed at 504 may be considered part of the electrode.

A layer of piezoelectric material(s) is slot-die coated on the substrate (e.g. on the seed layer(s)), at 506. 506 is analogous to 306. Thus, a thin film of liquid used to form a piezoelectric layer and having a controlled thickness is dispensed across the surface of the substrate (e.g. on the seed layer(s)) at 506. In some embodiments, another mechanism analogous to slot-die coating may be used at 506. In some embodiments, the piezoelectric is PZT. However, other and/or additional piezoelectric materials may be used in other embodiments. The thickness of the piezoelectric layer die-coated may be at least one hundred nanometers. In some embodiments, the layer of piezoelectric is at least two hundred nanometers thick. The piezoelectric layer may have a thickness of greater than three hundred nanometers. In some embodiments, the slot-die coated piezoelectric layer has a thickness of at least three hundred fifty micrometers. In some such embodiments, the thickness of the layer may be at least four hundred nanometers or more. In some embodiments, the layer of piezoelectric material is not more than five hundred nanometers thick.

Figure 6A:
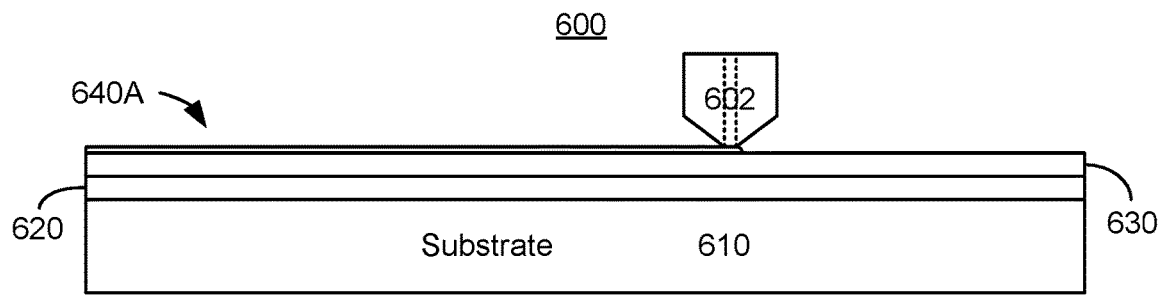
FIGS. 6A-6J depict another embodiment of piezoelectric devices during fabrication.

FIG. 6A depicts piezoelectric device 600 during 506. Substrate 610 having a length, thickness and width in the ranges described above is shown. For example, the thickness may be nominally one hundred micrometers, the width may be three hundred millimeters or more and length may be at least as large as width. Etch stop layer(s) 620 and starter layer(s) 630 are shown. For simplicity, barrier and seed layers are not separately indicated in FIGS. 6A-6J. Slot-die 602 is also shown dispensing layer 640A of piezoelectric liquid.

Figure 6B:
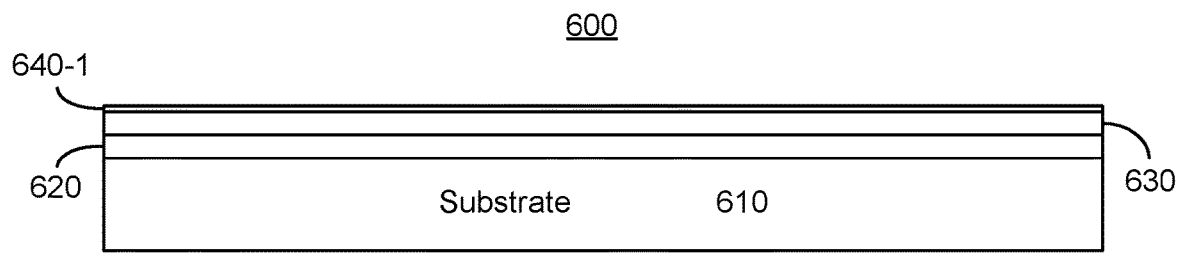

The layer of piezoelectric is heat treated, at 508. Heat treating at 508 is analogous to heat treating at 308 of method 300. Thus, analogous baking processes may be utilized for solvent removal, pyrolysis and crystallization. As discussed above, crystallization may not be carried out for every layer FIG. 6B depicts piezoelectric device 600 after 508 has been performed. Thus, piezoelectric layer 640-1 having thickness has been formed on starter layer(s) 630. The thickness of piezoelectric layer 640-1 may be as described above. For example, piezoelectric layer 640-1 may be at least two hundred nanometers thick, or thicker in some embodiments. Piezoelectric layer 640-1 is also of relatively constant thickness across the large surface of substrate 610 in some embodiments. For example, the variations in the thickness may be in the ranges discussed above. This control over the thickness of piezoelectric layer 640-1 may be due in part to the use of slot-die coating as well as to the low surface roughness of substrate 610.

The slot-die coating of 506 and heat treating of 508 are alternately repeated, at 510. These steps are repeated to provide a piezoelectric having a desired total thickness. For example, the piezoelectric multilayer may have a total thickness that is at least one micrometer. In some embodiments, the total thickness may be at least five micrometers. In some embodiments, the total thickness of the piezoelectric multilayer may be at least ten micrometers. In some embodiments, the piezoelectric multilayer may be at least twenty micrometers thick. However, in some embodiments, the thickness of the piezoelectric multilayer may be limited. For example, the piezoelectric multilayer may be not more than twenty micrometers thick.

Figure 6C:
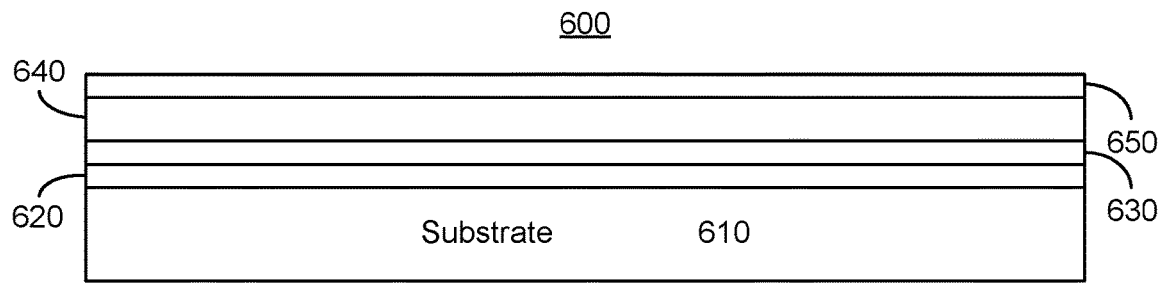

A top electrode is provided, at 512. The electrode may be formed by printing, sputtering and/or otherwise depositing conductive layer(s) for the electrode and, optionally, patterning the layer(s). FIG. 6C depicts piezoelectric device 600 after 512. Thus, a piezoelectric multilayer 640 and electrode 650 are present. For simplicity, the number of layer(s) in piezoelectric multilayer is not shown.

In some embodiments, the piezoelectric layer is poled, at 514. Poling aligns the dipoles in the piezoelectric layer to enhance (or obtain) the piezoelectric effect. In some embodiments, 514 may be accomplished using a corona, as described above. In some embodiments, poling at 514 is performed before the electrode is formed at 512. In other embodiments, poling at 514 is performed after electron deposition at 512. In other embodiments, poling may be omitted.

The back of the substrate may be desired to be partially or completely removed. For example, for a substrate having a thickness of one hundred micrometers, it may be desirable to thin the substrate down to ten micrometers or less. Thus, the back of the substrate may be masked, at 516. The substrate may also be removed from the backside, at 518. In some embodiments, portions of the substrate are completely removed. For example, a stainless steel etch can be performed. The etch chemistry is such that the etch does not significantly penetrate the etch stop (e.g. Ni) layer. Thus, the stainless steel substrate may be completely removed in some or all regions. As a result, the thickness of the device in such regions may be the sum of the thicknesses of the etch stop layer (e.g. ten micrometers), the starter layers (e.g. a few micrometers for the barrier and seed layers), the piezoelectric (e.g. ten micrometers) and the top electrode (e.g. a few micrometers).

Figure 6D:
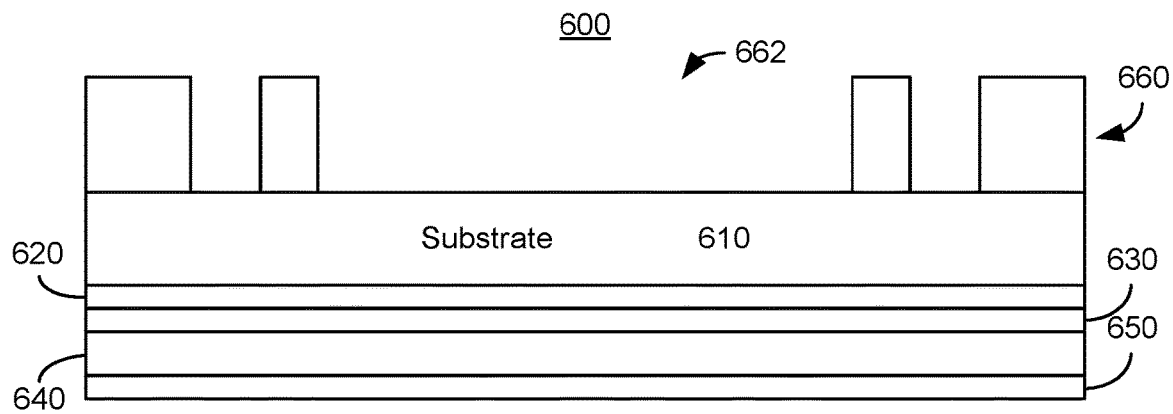
Figure 6E:
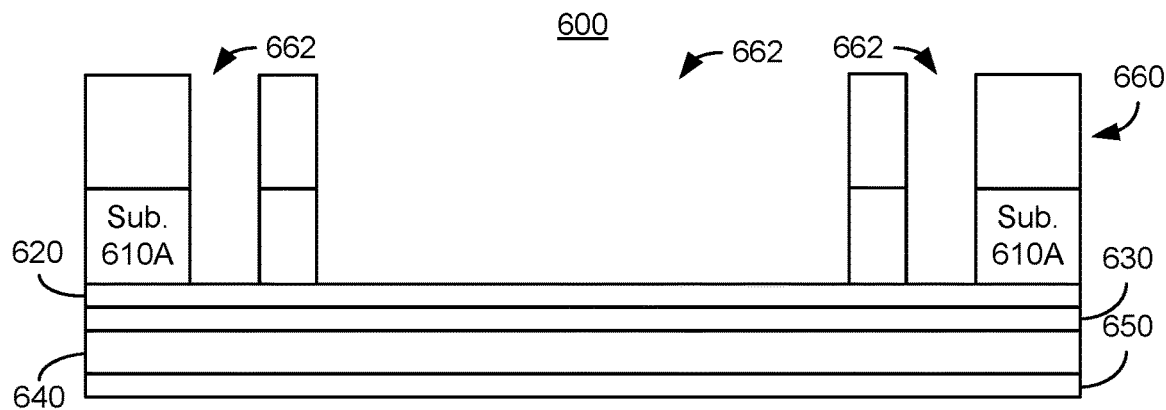

FIG. 6D depicts piezoelectric device 600 with back of substrate 610 covered by mask 660 having apertures 662 for the etch process. Thus, at 516 mask 660 is formed. FIG. 6E depicts piezoelectric device 660 after the etch is performed at 518. In the embodiment shown in FIG. 6E, substrate is completely removed below apertures 662. In other embodiments, some portion of the substrate may remain below apertures 662. Remaining substrate 610A is covered by mask 660.

Figure 6F:
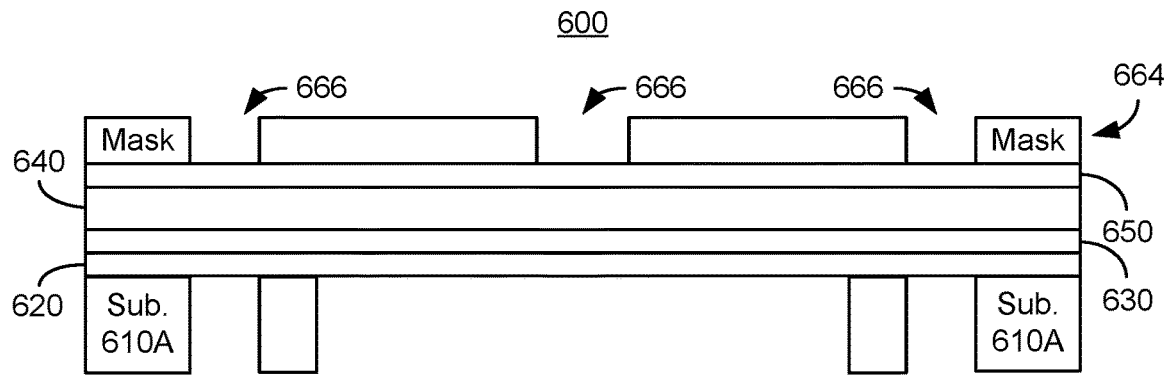
Figure 6G:
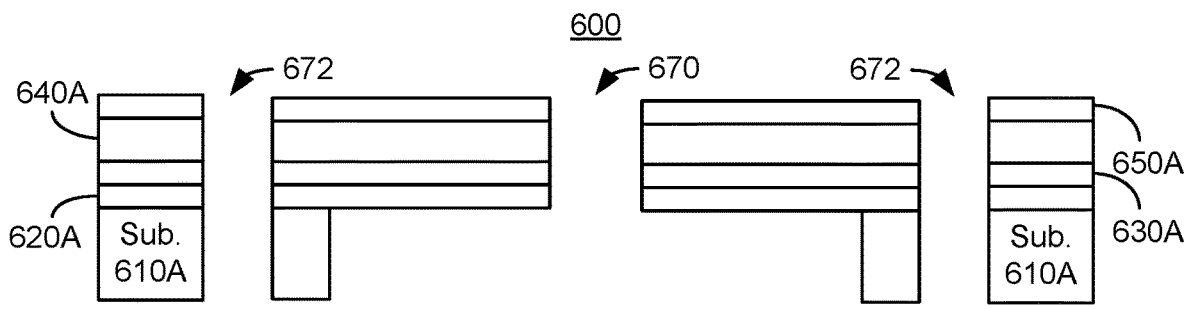

Fabrication of the MEMS piezoelectric devices may be completed, at 520. For example, layers 620, 630, 540 and/or 650 may be further patterned and other components formed. For example, apertures may be opened in the piezoelectric device. FIG. 6F depicts a mask 664 formed on piezoelectric layer(s) 650. Mask 664 includes apertures 666 therein. FIG. 6G depicts piezoelectric device after a portion of piezoelectric layer 640 exposed by apertures 666 have been removed. Thus, apertures 670 and 672 have been formed the removal process. Mask 664 has also been removed in FIG. 6G. Thus, method 500 may form a piezoelectric actuator 600 having apertures 670 and 672 through which fluid may flow.

Figure 6H:
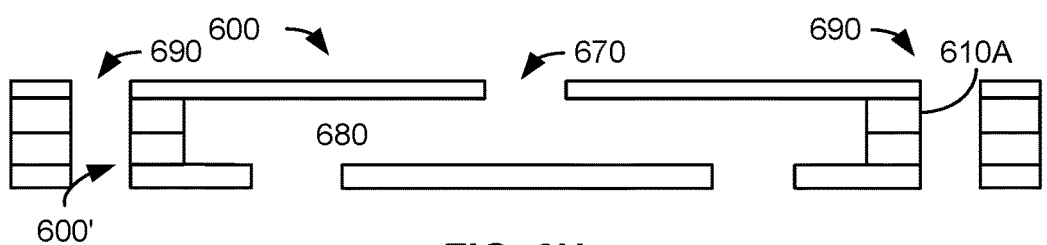

Multiple piezoelectric devices may be combined to form more complex structures as part of 520. For example, FIG. 6H depicts piezoelectric device 600 combined with piezoelectric device 600'. For simplicity, the individual layers of piezoelectric devices 600 and 600' are not shown. Piezoelectric device 600' may also be an actuator. However, its apertures, or vents, are located away from its central axis. The substrates 610A and corresponding substrate for piezoelectric device 600' have been affixed together. Thus, a chamber 680 is formed between piezoelectric actuators 600 and 600'. Ducts 690 have also been formed by the alignment of apertures 672 and corresponding apertures in actuator 600'. Actuators 600 and 600' may be electrically driven to vibrate in phase or out-of-phase.

Figure 6I:
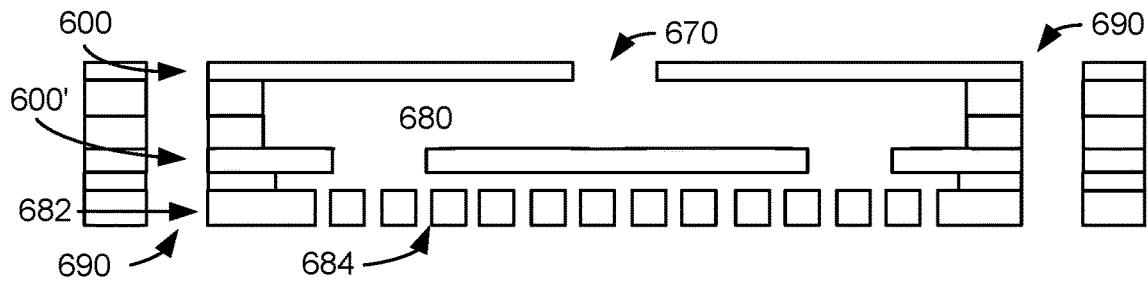

FIG. 6I depicts actuators 600 and 600' after further processing at 520. An orifice plate 682 including orifices 684 has been affixed a small distance from piezoelectric actuator 600'. Actuators 600 and 600' can vibrate, drawing fluid in through aperture 670 into chamber 680, and out of apertures in piezoelectric actuator 600'. The fluid can be driven through orifices 684 at high speed. For example, fluid speeds in excess of thirty meters per second may be obtained outside of apertures 684.

Figure 6J:
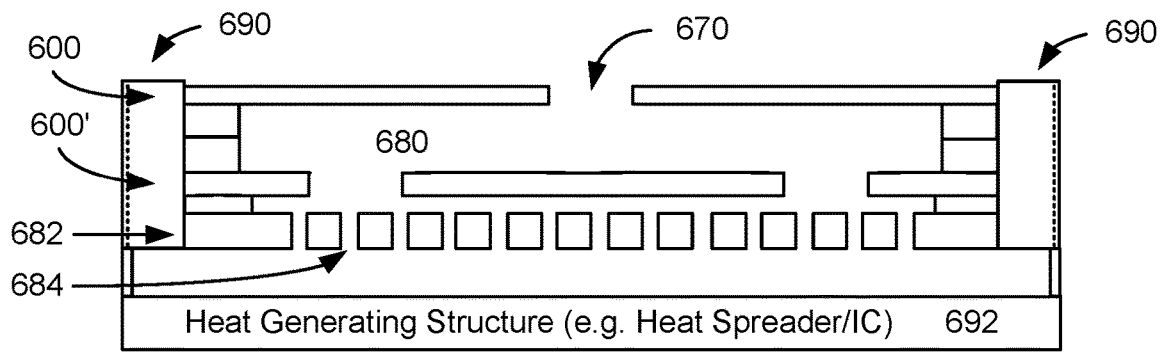

Piezoelectric actuators 600 and 600' in combination with orifice plate 682 may be used to cool structures. For example, FIG. 6J depicts piezoelectric actuators 600 and 600' used to cool heat-generating structure 692. Heat-generating structure 692 may be a heat spreader, integrated circuit, or other structure desired to be cooled. Because piezoelectric actuators 600 and 600' may have the dimensions described above, piezoelectric actuators 600 and 600' in combination with orifice plate may have a thickness of less than five hundred micrometers. Actuators 600 and 600' draw a fluid (e.g. air) into chamber 680 through aperture 670 and expel the fluid at high speeds through orifices 684 onto heat-generating structure 692. Heat from heat-generating structure 692 is transferred to the fluid. Ducts 690 may be used to carry heated fluid away from heat-generating structure 692. Thus, the combination may be used to cool mobile computing devices. Further, piezoelectric actuators 600 and 600', with or without apertures, may be used to entrain fluid flow, for example through ducts 690. Thus, actuators 600 and 600' may be utilized in a manner analogous to a fan.

Using method 500, MEMS piezoelectric devices, such as piezoelectric actuators 600 and 600' may be fabricated. Such MEMS piezoelectric devices have a total thickness (including substrate 610) of less than one millimeter and in some embodiments do not exceed two hundred and fifty microns. Using slot-die coating, thin, relatively constant thickness piezoelectric layers may be fabricated on a large substrate. Multiple such layers can be provided to produce a thicker piezoelectric multilayer having the desired thickness and relatively low variations in thickness across the substrate. As a result, manufacturing of piezoelectric devices in the desired size range, such as MEMS piezoelectric devices, may be more reliable. Further, because such piezoelectric layers may be fabricated on substrates having large surface areas, manufacturing of such piezoelectric devices may be scaled to higher throughputs. Consequently, producing MEMS piezoelectric devices may be improved. Such piezoelectric devices may be used for a variety of applications, including but not limited to cooling devices such as heat-generating structure 692.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of providing a piezoelectric device, comprising:
   depositing a barrier layer on a substrate having a substrate width;
   providing a first electrode layer on the substrate, the first electrode layer being provided on the barrier layer;
   coating at least one layer of piezoelectric material using slot-die coating such that a layer of the at least one layer of piezoelectric material has a variation in thickness of not more than ten percent;
   heat treating the at least one layer of piezoelectric material; and
   providing a second electrode layer on the at least one layer of piezoelectric material;
   wherein the slot-die coating further includes slot-die coating the at least one layer of piezoelectric material on the substrate, the at least one layer of piezoelectric material having a width of at least three hundred millimeters and not more than the substrate width.

2. The method of claim 1 further comprising:
   dividing the substrate into a plurality of piezoelectric devices.

3. The method of claim 1, further comprising:
   poling the at least one layer of piezoelectric material.

4. The method of claim 1, wherein each of the at least one layer of piezoelectric material has a thickness greater than two hundred nanometers.

5. The method of claim 4, wherein the thickness is greater than three hundred nanometers.

6. A method of claim 1, comprising:
   providing a first electrode layer on a substrate having a substrate width;
   coating at least one layer of piezoelectric material using slot-die coating such that a layer of the at least one layer of piezoelectric material has a variation in thickness of not more than ten percent;
   heat treating the at least one layer of piezoelectric material; and
   providing a second electrode layer on the at least one layer of piezoelectric material;
   wherein the slot-die coating further includes slot-die coating the at least one layer of piezoelectric material on the substrate, the at least one layer of piezoelectric material having a width of at least three hundred millimeters and not more than the substrate width;
   wherein the substrate is a stainless steel substrate having a thickness of not more than one hundred micrometers.

7. The method of claim 6, wherein the stainless steel substrate has a surface having a surface roughness of not more than three nanometers, the first electrode layer being provided on the surface.

8. The method of claim 6, wherein the stainless steel substrate has a first surface and a second surface opposite to the first surface, the method further comprising:
   depositing an etch stop layer on the first surface, the first electrode layer being provided on the etch stop layer; and
   removing a portion of the stainless steel substrate from the second surface to provide a thinned substrate not more than twenty micrometers thick.

9. The method of claim 8, wherein the removing further includes:
   etching the portion of the stainless steel substrate to the etch stop layer.

10. The method of claim 9, wherein the etching provides a plurality of depressions, the method further comprising:
    dividing the substrate into a plurality of devices.

11. A method of providing a piezoelectric device, comprising:
    depositing a barrier layer on a first surface of a stainless steel substrate, the stainless steel substrate having a width of at least three hundred millimeters and not more than six hundred millimeters, a length of at least three hundred millimeters and not more than six hundred millimeters, a substrate thickness of not more than one hundred micrometers and a second surface opposite to the first surface, the first surface having a surface roughness of not more than three nanometers;
    providing a first electrode layer on the barrier layer;
    coating a layer of piezoelectric material, the layer of piezoelectric material being greater than four hundred nanometers thick, the coating using slot-die coating such that the layer of piezoelectric material has a variation in thickness of not more than ten percent;
    heat treating the layer of piezoelectric material;
    repeating the slot-die coating and baking to provide a plurality of layers of piezoelectric material, the plurality of layers of piezoelectric material having a thickness of at least five micrometers; and
    providing a second electrode layer on the plurality of layers of piezoelectric material.

12. The method of claim 11, further comprising:
    depositing an etch stop layer, the barrier layer being provided on the etch stop layer;
    forming a plurality of cavities extending from the second surface of the stainless steel substrate after the providing the second electrode layer, the plurality of cavities terminating at a portion of the etch stop layer; and forming a plurality of apertures through the first electrode layer, the plurality of layers of piezoelectric material and the second electrode layer.

13. The method of claim 12, further comprising:

aligning the stainless steel substrate to a second stainless steel substrate having a second plurality of cavities, a second plurality of apertures, a second plurality of piezoelectric layers, and an additional pair of electrodes, the second plurality of piezoelectric layers being between the additional pair of electrodes, the plurality of cavities being aligned with the second plurality of cavities, the plurality of apertures being aligned with the second plurality of apertures;

affixing the stainless steel substrate to the second stainless steel substrate to form a dual actuator sheet;

affixing an orifice plate sheet to the dual actuator sheet to form a MEMS piezoelectric cooling device sheet; and dividing the MEMS piezoelectric cooling device sheet into a plurality of MEMS piezoelectric cooling devices.

* * * * *